United States Patent

Ohta

[11] Patent Number: 5,136,273
[45] Date of Patent: Aug. 4, 1992

[54] MAGNET APPARATUS FOR USE IN A MAGNETIC RESONANCE IMAGING SYSTEM

[75] Inventor: Tadatoshi Ohta, Tachikawa, Japan

[73] Assignee: Kabushiki Kaisha Toshiba, Kawasaki, Japan

[21] Appl. No.: 509,199

[22] Filed: Apr. 16, 1990

[30] Foreign Application Priority Data

Oct. 17, 1988 [JP]  Japan ............................. 63-260878
Oct. 25, 1989 [JP]  Japan ............................. 1-275956

[51] Int. Cl.⁵ ................................................ G01V 3/00
[52] U.S. Cl. ................................. 335/301; 335/299; 324/319
[58] Field of Search ............... 335/301, 304, 299; 324/318, 319, 320

[56] References Cited

U.S. PATENT DOCUMENTS

| 4,490,675 | 12/1984 | Knuettel . |
| 4,580,120 | 4/1986 | Jacquot ................... 335/301 |
| 4,587,490 | 5/1986 | Muller et al. ........... 335/301 |
| 4,587,504 | 5/1986 | Brown et al. ........... 335/301 |
| 4,590,428 | 5/1986 | Miller . |

FOREIGN PATENT DOCUMENTS

| 138270 | 4/1985 | European Pat. Off. . |
| 0187691 | 7/1986 | European Pat. Off. . |
| 0238909 | 9/1987 | European Pat. Off. . |
| 0334382 | 9/1989 | European Pat. Off. . |
| 62-293704 | 12/1987 | Japan . |
| 1253214 | 3/1988 | Japan . |
| 63-166203 | 7/1988 | Japan . |
| 63-260116 | 10/1988 | Japan . |
| 64-28805 | 1/1989 | Japan . |
| 2070254 | 9/1981 | United Kingdom . |
| 2204737 | 11/1988 | United Kingdom . |
| 2215471 | 9/1989 | United Kingdom . |

*Primary Examiner*—Leo P. Picard
*Assistant Examiner*—Ramon M. Barrera
*Attorney, Agent, or Firm*—Cushman, Darby & Cushman

[57] ABSTRACT

A magnet apparatus has an active magnetic shield or a cancel coil disposed coaxially with a main coil at an end portion thereof so that the structure of the magnet apparatus is simplified and the both coils are easily assembled together. The outer diameter of the magnet apparatus is rendered small because it is unnecessary to increase the radius of the apparatus. No misalignment between the main coil and the cancel coil occurs due to an assembly error and/or a magnetomotive force generated when the coils are excited, whereby the static magnetic field is prevented from being distributed unevenly and the tomographic image is refrained from being deteriorated.

10 Claims, 3 Drawing Sheets

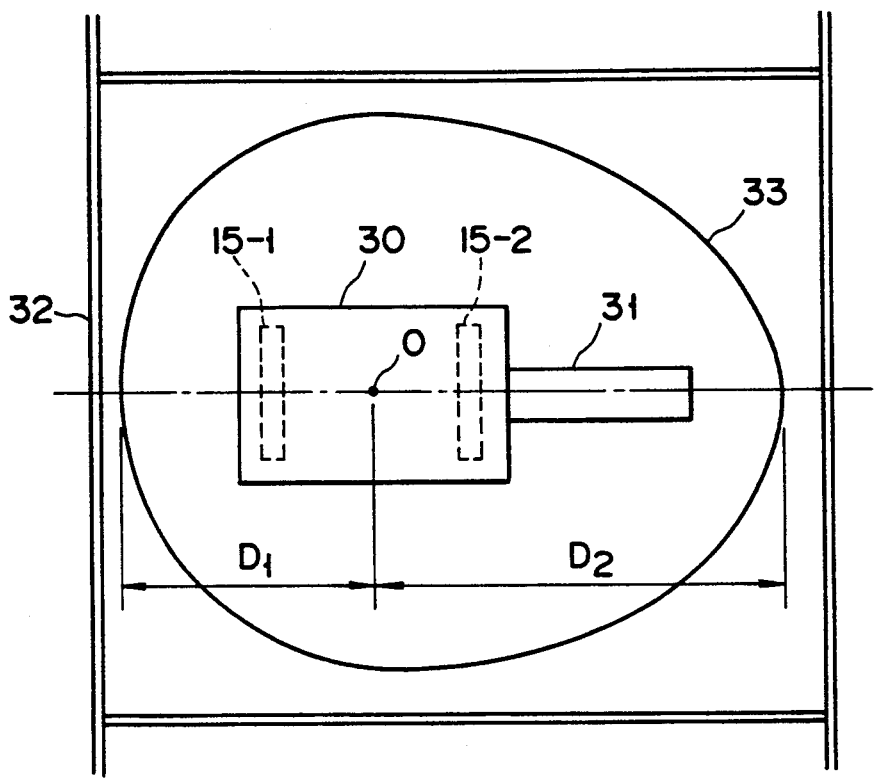
F I G. 3
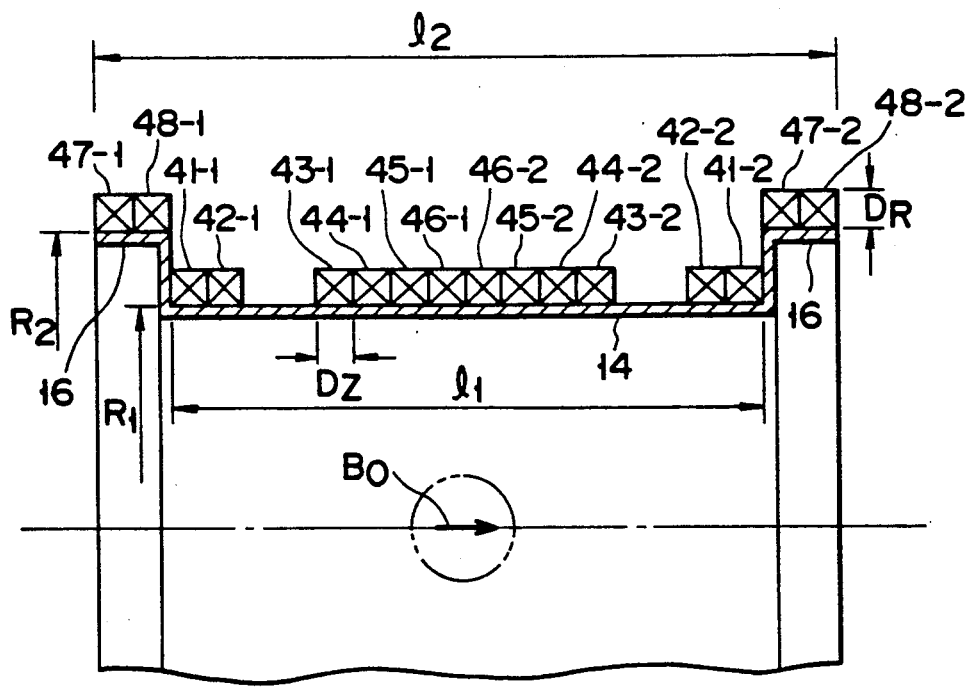
F I G. 4

MAGNET APPARATUS FOR USE IN A MAGNETIC RESONANCE IMAGING SYSTEM

BACKGROUND OF THE INVENTION

1. Field of the Invention

The present invention relates to a magnet apparatus for use in a magnetic resonance imaging system, and more particularly to a magnet apparatus having a magnetic shield.

2. Description of the Related Art

A magnet apparatus in use in a magnetic resonance imaging system (hereinafter referred to as the "MRI system") has a bore for receiving an object to be examined or a patient. A working volume in which a to-be-diagnosed portion of the object is located is defined in the bore. A static magnetic field or a main magnetic field is generated in the working volume by a main coil. A gradient magnetic field is superposed on the static magnetic field, and a high frequency signal is applied to the to-be-diagnosed portion of the object so that a tomographic image of the to-be-diagnosed portion is obtained.

The magnetic fluxes of the magnetic field leak from the bore to form a leaked magnetic field outside of the bore. The leaked magnetic field sometimes causes an adverse effect on the atmosphere around the MRI system. In order to eliminate this effect, a magnet apparatus is provided with a magnetic shield for reducing the leaked magnetic field. The magnetic shield is an active magnetic shield or cancel coils, for example.

The cancel coils generate a second magnetic field, the magnetic fluxes of which are directed in the direction opposite to that of the magnetic fluxes of the static magnetic field. The leaked magnetic field and the second magnetic field have substantially the same intensities. Therefore, both the magnetic fields cancel each other to reduce the leaked magnetic field greatly.

In the conventional magnet apparatus, cancel coils coaxially surround the main coil. A first bobbin of the main coil and a second bobbin of the cancel coils coaxially surrounding the first coil are used in order to arrange both coil like this. Since both coils have complicated structures, it is difficult to assemble them together. The axis of the second bobbin is sometimes deviated from that of the first bobbin due to an assembly error between both the coils and/or due to an electromagnetic force produced when the coils are excited. This causes the cancel coils to make misalignment with the main coil, with the result that a uniform static magnetic field is not maintained in the working volume and the tomographic image is deteriorated. Further, since the cancel coils are arranged radially outside of the main coil, the outer diameter of the magnet apparatus is rendered relatively large, making it difficult to transport the magnet apparatus.

SUMMARY OF THE INVENTION

The object of this invention is to provide a magnet apparatus for use in a magnetic resonance imaging system, which has a simple structure and a relatively small outer diameter, and in which a static magnetic field is distributed uniformly in the working volume defined in a bore.

According to the present invention, there is provided a magnetic apparatus for use in a magnetic resonance imaging system having a bore for housing an object to be examined and an axis passing through the bore, said apparatus comprising: a main coil for producing a main magnetic field along the axis in the bore, so that the magnetic fluxes leak from the bore, said main coil having a first bobbin coaxially surrounding the bore; and active magnetic shield means for producing a second magnetic field in a direction opposite to the leaked magnetic field so that the second magnetic field cancels out most part of leaked magnetic field to reduce the leaked magnetic fluxes, said active shield means having a second bobbin arranged coaxially with the first bobbin at one end thereof and formed integral therewith.

The magnet apparatus according to the present invention has an active magnetic shied (or a cancel coil) coaxially disposed outside of a main coil at least at one end thereof. Therefore, it has a simpler structure and has two coils more easily assembled together than the conventional magnet apparatus. The magnet apparatus of the present invention has a small outer diameter, because it is unnecessary to increase its radius. The axes of the first bobbin of the main coil and the second bobbin of the cancel coil are rarely deviated from each other due to an assembly error and an magnetomotive force when both the coils are excited. As a result, the static magnetic field in the working volume defined in the bore is prevented from being distributed unevenly and the tomographic image is refrained from being deteriorated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The present invention will be fully understood from the following detailed description with reference to the accompanying drawings in which:

FIG. 3 is a plan view of a diagnosis room in which an MRI system is arranged;

FIG. 4 is a longitudinal sectional view of a magnet apparatus according to the second embodiment of the present invention;

DETAILED DESCRIPTION OF THE PREFERRED EMBODIMENTS

Figure 1:
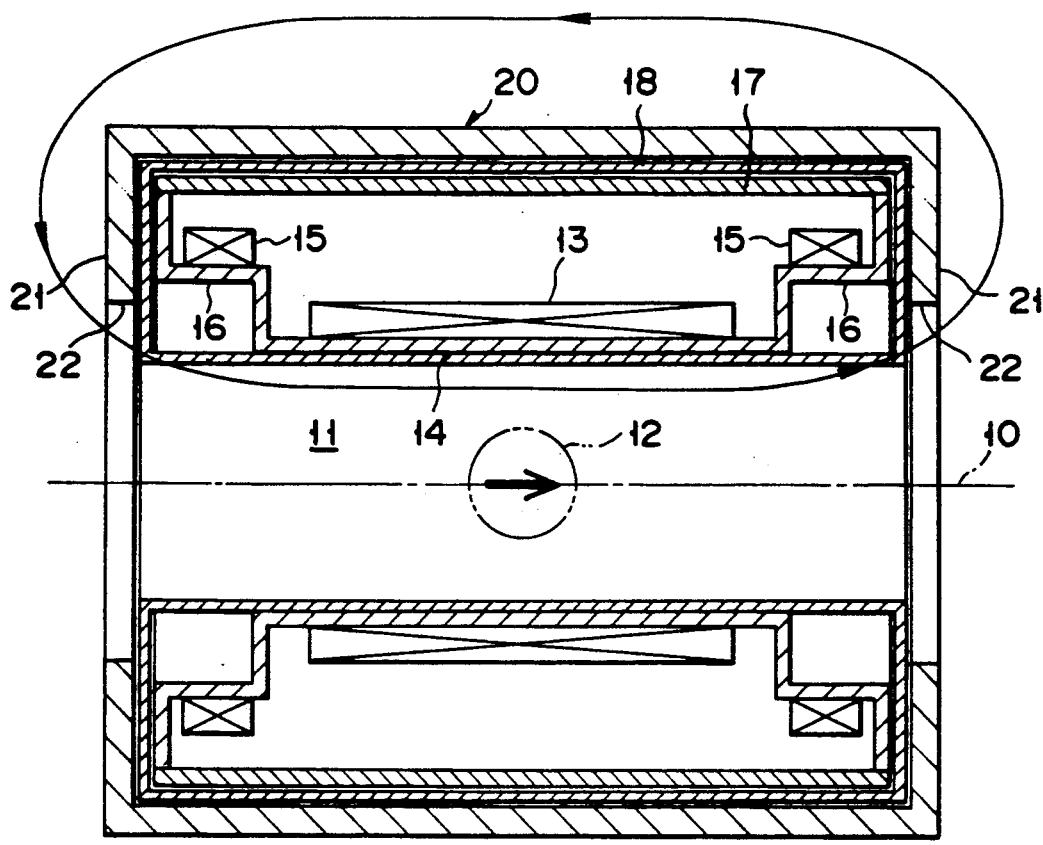
FIG. 1 is a longitudinal sectional view of a magnet apparatus according to the first embodiment of the present invention.

FIG. 1 shows a magnet apparatus for use in an MRI system according to the first embodiment of the present invention. The magnet apparatus has a bore 11 for receiving an object to be examined or a patient. A working volume 12 is defined in the bore 11. A main coil 13 having a first bobbin 14 surrounds the bore 11 so as to produce a static magnetic field in the working volume 12. The axis of the main coil 13 is denoted by 10.

A pair of cancel coils 15 are arranged coaxially with the axis 10 and outside the main coil 13 in the axial direction. Each cancel coil 15 has larger outer diameter than the main coil 11. Thus, the second bobbin 16 of the cancel coil 15 has a larger outer diameter than the first bobbin 14 of the main coil 13. The bobbin 16 is formed integral with the bobbin 14. Bobbins 14 and 16 define the internal peripheral surface of a double cylindrical-shaped cryostat 17. The cryostat 17 is housed in a double cylindrical-shaped vacuum container 18.

Figure 2:
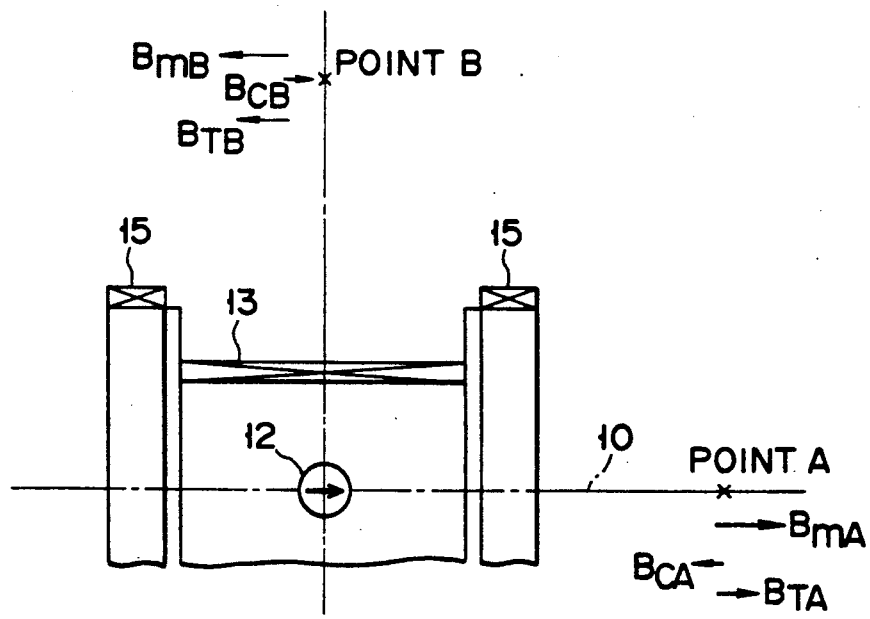
FIG. 2 is a schematic view illustrating the operation of the magnet apparatus of FIG. 1.

Referring to FIG. 2, the operation of the cancel coils 15 will now be explained.

A current is caused to flow in the cancel coils 15 in a direction opposite to that of the current flowing in the main coil 13, so that the cancel coils 15 produce a second magnetic field. The magnetic fluxes of the second field is directed in the direction opposite to that of the magnetic fluxes of the static magnetic field. For example, at a point A on the axis 10, a second magnetic field $B_{CA}$ due to the cancel coils 15 and a static magnetic field $B_{mA}$ (the leaked magnetic field) are superposed on each other. The second magnetic field $B_{CA}$ cancels out most of the leaked magnetic field $B_{mA}$ to reduce the intensity of the leaked magnetic field at the point A to a small value of $B_{TA}$. Likewise, the intensity of the leaked magnetic field is reduced at a point B disposed radially outside of the main coil 11.

In particular, the cancel coils 15 are disposed outside the main coil 11 in the axial direction and has a larger outer diameter than the main coil 11. The leaked fluxes leaking in parallel with the axis 10 from the bore 10 are reduced at an approximately same rate as in the conventional case. As shown by an looped arrow in FIG. 1, the leaked magnetic fluxes, which leak along the circumferential wall from one end of the bore 11 and reenter the bore at the other end, are reduced much more than in the conventional case.

In the working volume 12, the static magnetic field is also reduced by the second magnetic field. Since, however, the cancel coils 15 are much more separated from the working volume 12 than the main coil 13, the reduction rate of the static magnetic field in the working volume 12 is much less than that of the leaked magnetic field and therefore does not influence diagnosis.

The magnet apparatus is provided with a yoke magnetic shield 20 made of a ferromagnetic substance. The yoke magnetic shield 20 has a pair of annular flanges (annular members) 21 which are provided at the outer end sides of the respective cancel coils 15 and have annular inner edge portions defining a pair of holes 22 for passing the object to be examined or the patient. The yoke magnetic shield 20 absorbs the leaked magnetic field through the annular inner edge portions of the flanges 21 to reduce the leaked magnetic field.

As seen from the above description, the cancel coil 15 drastically reduces the leaked magnetic field in cooperation with the magnetic shield 20.

In the first embodiment, the cancel coils 15 are arranged outside of the main coil 13 at its both ends, and the second bobbin 16 is formed integrally with the first coil frame 14. This structure makes the two coils simple in structure and assembled together very easily. Further, the magnet apparatus is reduced in outer diameter because it is unnecessary to increase its radius.

The integral structure of the two bobbin reduces an assembly error so as to prevent the misalignment of the axis of the second bobbin 16 with the axis of the first bobbin 14. Further, the axes of the first and second bobbins 14 and 16 are refrained from being misaligned, although magnetomotive forces are produced when the coils are excited. According to the feature in which the concentricity is maintained between the main coil and the cancel coils, the static magnetic field is prevented from being distributed unevenly and the tomographic image is also hindered from being deteriorated.

FIG. 3 is a plan view of a diagnosis room in which an MRI system 30 is arranged. Since a bed 31 is disposed at one side (the right side) of the MRI system 30, the system is arranged such that the other side (the left side) thereof is disposed near the wall 32 of the diagnosis room. In this arrangement, the leaked magnetic field leaking from the left side of the system sometimes influences the exterior of the wall 32.

In the first embodiment, the cancel coil 15-1 located at the left side of the system can have a larger magnetomotive force than the cancel coil 15-2 located at the right side thereof. In this case, the leaked magnetic field leaking from the right side of the MRI system 30 is greater than that leaking from the left side of the system. Specifically, as is shown in FIG. 3, the Gaussian curve 33 of the leaked magnetic field is asymmetric so that the right and left curve portions do not form an mirror image (that is, $D_1 < D_2$) such that the leaked magnetic field does not affect the exterior of the wall 32. Accordingly, the MRI system 30 can be disposed closer to the wall 32 to use the space of the diagnosis room effectively or to allow the MRI system to be arranged in a relatively small diagnosis room.

The use of the different magnetomotive forces of the two cancel coils may cause a magnetic field error in the working volume. However, this error can be eliminated by adjusting the main coil.

In the first embodiment, the MRI system has a pair of cancel coils. However, alternatively, a single cancel coil 15-1 may be provided on the left side of the MRI system 30. In this case, the intensity of the leaked magnetic field leaking from the left side of the MRI system is less than that leaking from the right side of the MRI system, whereby the leaked magnetic field leaking from the MRI system 30 is greatly prevented from affecting the exterior of the wall 32.

Referring to FIG. 4, the second embodiment of this invention will now be explained.

In this embodiment, the magnet apparatus of the first embodiment is further modified so as to be actually manufactured. The magnet apparatus comprises twelve main coils 41-1, 41-2, 42-1, 42-2, 43-1, 43-2, 44-1, 44-2, 45-1, 45-2, 46-1 and 46-2 made of superconducting coils, four cancel coils 47-1, 47-2, 48-1 and 48-2 also made of superconducting coils, and a first bobbin 14 and second bobbin 16 both having the same structure as those of the first embodiment.

When the magnetomotive forces as is shown in Table 1 are applied to the coils, the intensity of the central magnetic field in the working volume becomes 1.5T, and this intensity of the magnetic field is maintained throughout the working volume.

TABLE 1

| Coils | | | Magnetomotive Forces [AT] |
|---|---|---|---|
| DZ = 100 [mm] | 41-1 | 41-2 | 1844710 |
| DR = 30 [mm] | 42-1 | 42-1 | 59065 |
| | 43-1 | 43-2 | 419548 |
| $R_1$ = 600 [mm] | 44-1 | 44-2 | 39125 |
| $R_2$ = 800 [mm] | 45-2 | 45-2 | 195385 |
| | 46-1 | 46-2 | 145482 |
| $l_1$ = 1600 [mm] | 47-1 | 47-2 | −334940 |

TABLE 1-continued

| Coils | | | Magnetomotive Forces [AT] |
|---|---|---|---|
| $l_2$ = 2000 [mm] | 48-1 | 48-2 | −1260510 |

Table 2 shows the relationship between the intensities of the magnetic fields at the center of the working volume, at an axial position 6 m away from the center and at a radial position 4 m away from the center. In this table are shown the intensities of the magnetic fields produced by each coil at the indicated positions.

TABLE 2

| | Center | Axial Position 6 [m] | Radial Position 4 [m] |
|---|---|---|---|
| Main Coil | 2.288 [T] | 62.7 [G] | 91.3 [G] |
| Cancel Coils | −0.788 | −57.4 | −86.4 |
| Total | 1.500 | 5.3 | 4.9 |

Since a pair of cancel coils are arranged outside the main coil in the axial direction, the leaked magnetic field is greatly reduced. As compared with the conventional case, it is very easy to assembly the two kinds of coils together and an accurate concentricity of the second bobbin 16 with the first bobbin 14 is ensured. Accordingly, the static magnetic field in the working volume defined in the bore is prevented from being distributed unevenly and the tomographic image does not become deteriorated.

Figure 5:
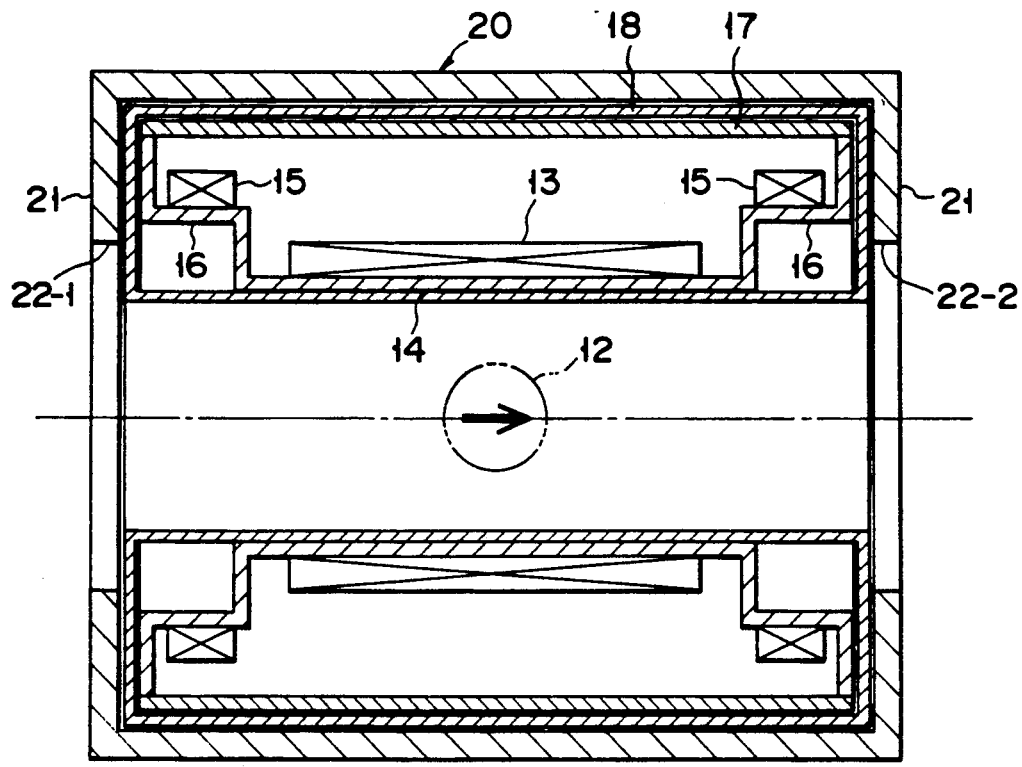
FIG. 5 is a longitudinal sectional view of a magnet apparatus according to the third embodiment of the present invention.

The third embodiment of the present invention will now be explained with reference to FIGS. 5, 6A and 6B.

In an MRI system according to the third embodiment, a hole 22-1 in the left end wall of a yoke shield 20 has a smaller diameter than a hole 22-2 in the right end wall thereof.

Figure 6A:
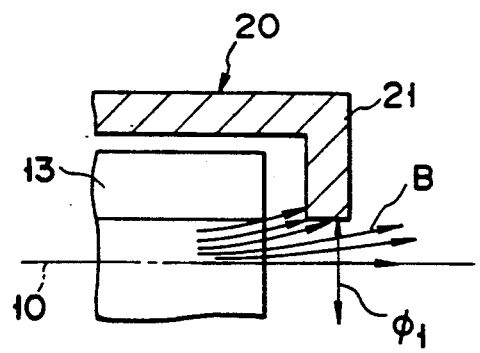
FIGS. 6A and 6B are partially sectional views of magnet apparatuses, the views illustrating the leaked magnetic fields which are absorbed by a yoke magnetic shields.
Figure 6B:
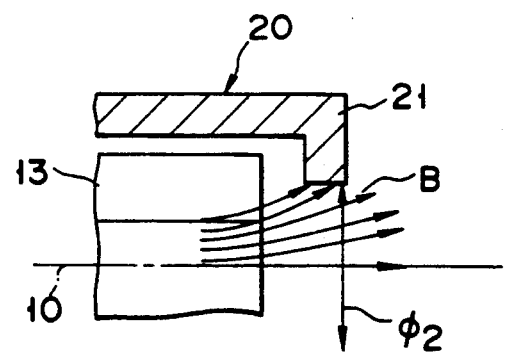

When the diameter $\phi_1$ of the hole in the end wall of the shield is small, as is shown in FIG. 6A, a large amount of the leaked magnetic field B is absorbed by the annular inner portion of the flange 21 of the shield. On the other hand, when the diameter $\phi_2$ of the hole in the end wall of the shield is large, as is shown in FIG. 6B. a small amount of the magnetic field B is absorbed by the annular inner portion of the flange of the shield.

According to the MRI system of the third embodiment, the hole in the end of the shield at the left-side of the MRI system (that is, the hole closer to the wall 32) is rendered smaller than the hole in the end of the shield at the right side of the system (i.e., the hole closer to the bed) in the diagnosis room, as is shown in FIG. 3. The leaked magnetic field leaking from the MRI system at its left side is much more reduced than that at its right side. Accordingly, the leaked magnetic field leaking from the MRI system is prevented from affecting the exterior of the wall 32. This arrangement enables the MRI system 30 to be disposed closer to the wall 32 and thus allows the diagnosis room to be utilized effectively. Further, the MRI system can be provided in a relatively small diagnosis room.

In the above embodiments, the main coils and the cancel coils may be superconducting coils or normally conducting coils. Further, they may be of solenoid type or of Helmholtz type instead.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A magnetic resonance imaging system having a first side and a second side opposing each other, said system comprising:
    a hollow cylindrical tube, having an axis passing therethrough, the axis being substantially perpendicular to the first side and the second side, for housing an object to be examined;
    a bed disposed at the first side of the magnetic resonance imaging system along the axis;
    a main coil for producing a main magnetic field along the axis in the hollow cylindrical tube and causing magnetic fluxes to leak from the follow cylindrical tube; and
    active magnetic shield means for producing a second magnetic field in a direction opposite to the leaked magnetic fluxes, the second magnetic field having a first component produced at the first side of the system wherein the bed is disposed and a second component produced at the second side, the field strength of the second component being larger than the field strength of the first component, the second magnetic field cancelling a portion of the leaked magnetic field to reduce the leaked magnetic fluxes such that an amount of magnetic fluxes leaking from the second side is smaller than an amount of magnetic fluxes leaking from the first side.

2. A magnetic resonance imaging system according to claim 1, wherein said active magnetic shield means includes a cancel coil for producing the second magnetic field.

3. A magnetic resonance imaging system according to claim 1, wherein said active magnetic shield means includes a pair of cancel coils for producing the second magnetic field.

4. A magnetic resonance imaging system according to claim 3, wherein one of said pair of cancel coils has a larger magnetomotive force than the other cancel coil.

5. A magnetic resonance imaging system according to claim 2 or 3, wherein said cancel coil has a larger outer diameter than said main coil.

6. A magnetic resonance imaging system having a first side and a second side opposing each other, said system comprising:
    a hollow cylindrical tube, having an axis passing therethrough, the axis being substantially perpendicular to the first side and the second side, for housing an object to be examined;
    a bed disposed at the first side of the magnetic resonance imaging system along the axis;
    a main coil, coaxially surrounding the hollow cylindrical tube, for producing a main magnetic field along the axis of the hollow cylindrical tube and causing magnetic fluxes to leak from the hollow cylindrical tube;
    yoke magnetic shield means, including a pair of annular members arranged outside said main coil in the axial direction, the pair of annular members defining a first hole at the first side of the system and a second hole at the second side of the system, the pair of annular members absorbing a first portion of the leaked magnetic fluxes, a diameter of the first hole being larger than a diameter of the second hole; and a pair of cancel coils, arranged coaxially with the hollow cylindrical tube and outside said main coil in the axial direction, for producing a second magnetic field in a direction opposite to the leaked magnetic fluxes so that the second magnetic field cancels out a second portion of the leaked magnetic fluxes, said yoke shield means and cancel coils cooperating with each other to reduce the leaked magnetic fluxes such that an amount of the magnetic fluxes leaking from the second side is smaller than an amount of the magnetic fluxes leaking from the first side.

7. A magnetic resonance imaging system 6, wherein said main coil has a first bobbin and said cancel coil has a second bobbin arranged coaxially with the first bobbin at one end thereof and formed integral therewith.

8. A magnetic resonance imaging system having a first side and a second side opposing each other, said system comprising:

a hollow cylindrical tube, having an axis passing therethrough, the axis being substantially perpendicular to the first side and the second side, for housing an object to be examined;

a bed disposed at the first side of the magnetic resonance imaging system along the axis;

a main coil, coaxially surrounding the hollow cylindrical tube, for producing a main magnetic field along the axis and causing magnetic fluxes to leak from the hollow cylindrical tube;

a pair of cancel coils, arranged coaxially with the hollow cylindrical tube and outside said main coil in the axial direction opposite to the leaked magnetic field, said second magnetic field having a first component produced at the first side and a second component produced at the second side, the field strength of the second component being larger than the field strength of the first component, the second magnetic field cancelling a first portion of the leaked magnetic field such that an amount of the magnetic fluxes leaking from the second side is smaller than an amount of the magnetic fluxes leaking from the first side; and yoke magnetic shield means, including a pair of annular members arranged outside said main coil in the axial direction, the pair of annular members defining a first hole at the first side of the system and a second hole at the second side of the system, the pair of annular members absorbing a second portion of the leaked magnetic fluxes, said pair of cancel coils and said yoke shield means cooperating with each other to reduce the leaked magnetic fluxes.

9. A magnetic resonance imaging system according to claim 8, wherein a diameter of the first hole is larger than a diameter of the second hole.

10. A magnetic resonance imaging system 8, wherein one of said cancel coils has a larger magnetomotive force than the other cancel coil.

* * * * *

UNITED STATES PATENT AND TRADEMARK OFFICE
CERTIFICATE OF CORRECTION

PATENT NO. : 5,136,273
DATED : August 4, 1992
INVENTOR(S) : Tadatoshi Ohta

It is certified that error appears in the above-indentified patent and that said Letters Patent is hereby corrected as shown below:

On the title page: Item [30] Foreign Application Priority Data
Oct. 17, 1988 (JP) Japan ............63-260878 not being claimed.

Signed and Sealed this

Fourteenth Day of September, 1993

Attest:

BRUCE LEHMAN

*Attesting Officer*     *Commissioner of Patents and Trademarks*